United States Patent [19]

Ebata

[11] Patent Number: 4,807,561

[45] Date of Patent: Feb. 28, 1989

[54] SEMICONDUCTOR VAPOR PHASE GROWTH APPARATUS

[75] Inventor: Hitoshi Ebata, Shizuoka, Japan

[73] Assignee: Toshiba Machine Co., Ltd., Tokyo, Japan

[21] Appl. No.: 48,839

[22] Filed: May 12, 1987

[30] Foreign Application Priority Data

May 19, 1986 [JP] Japan .................... 61-115498

[51] Int. Cl.⁴ .............................. B05C 11/00
[52] U.S. Cl. .................... 118/697; 118/729
[58] Field of Search .................. 118/697, 729

[56] References Cited

U.S. PATENT DOCUMENTS 3,790,404 2/1974 Garnache et al. .
4,430,959 2/1984 Ebata et al. .

Primary Examiner—Bernard Pianalto
Attorney, Agent, or Firm—Oblon, Flsher, Spivak, McClelland & Maier

[57] ABSTRACT

A vapor phase growth substrate is conveyed into a heated atomosphere, and vapor phase growth gas is supplied from a nozzle connected to a gas supply means to the substrate in the middle portion of conveyance. Process program information relating to the conveying speed of the substrate, the heating temperature, the gas flow rate and the types of the gases being used is stored, in advance, in a memory of a controller, the information is read from the memory, to adoptively control the conveying speed of the substrate, the heating temperature, and the gas supply.

5 Claims, 16 Drawing Sheets

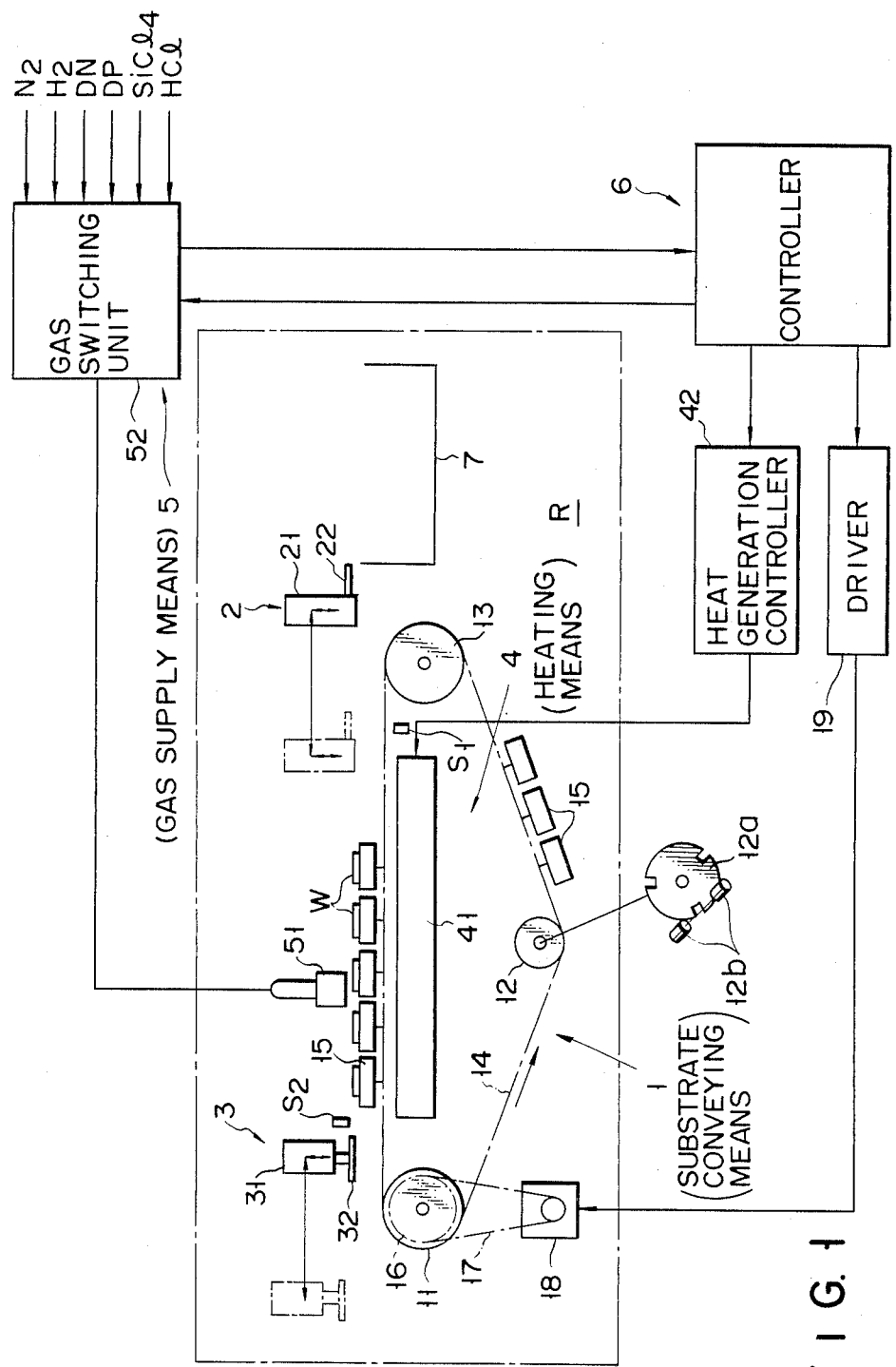
F I G. 1

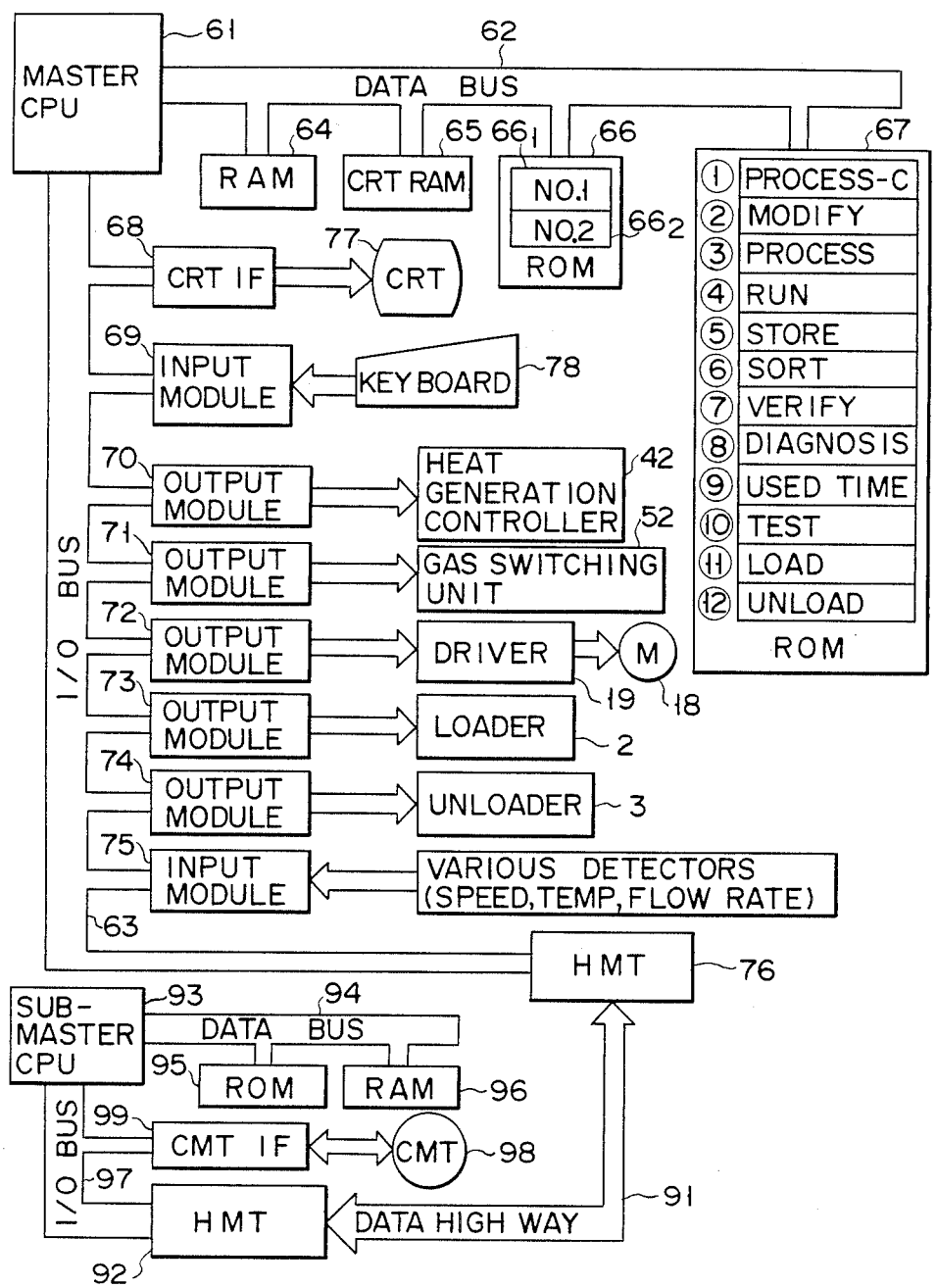
F I G. 2

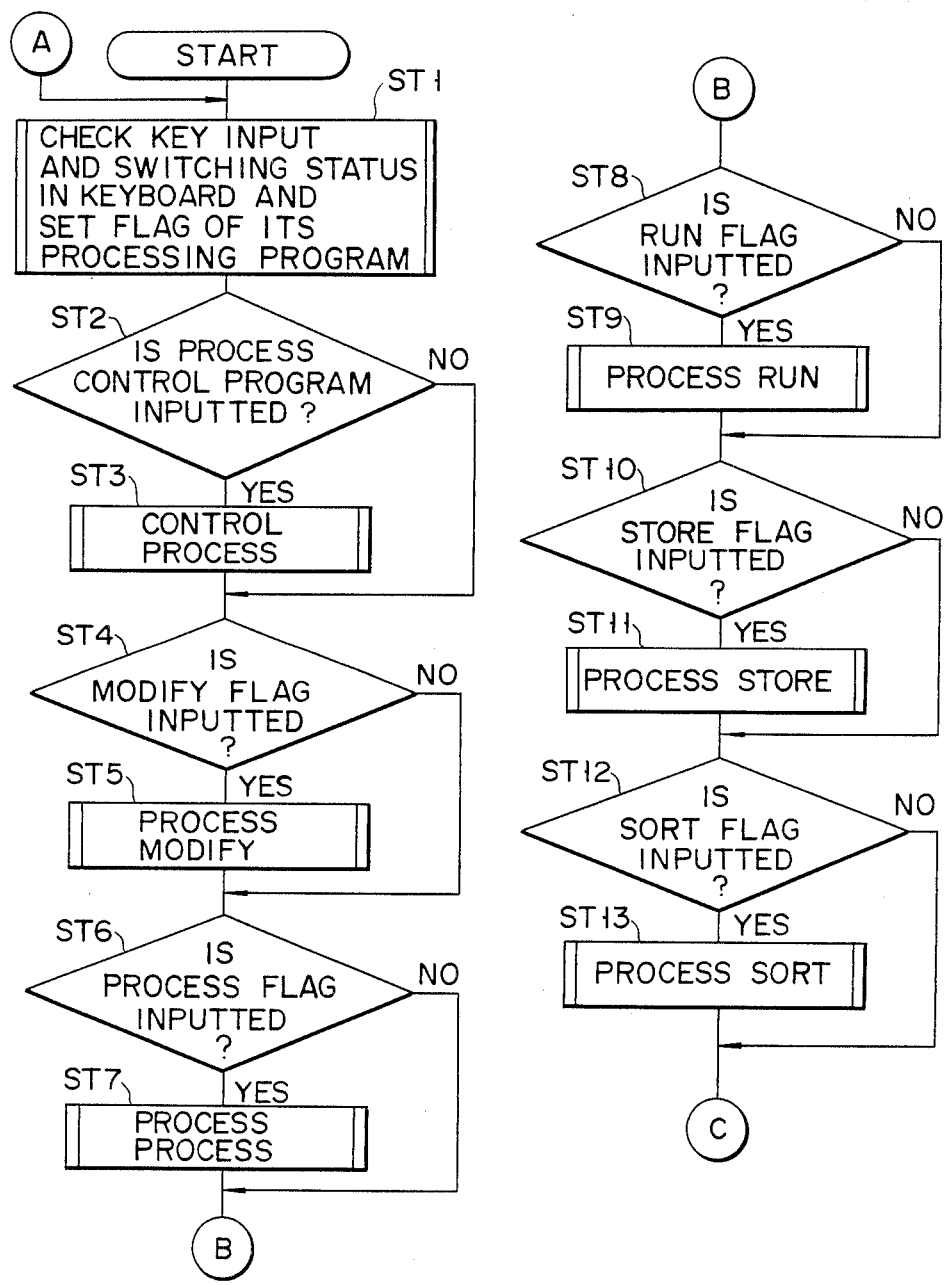
F I G. 4(A)

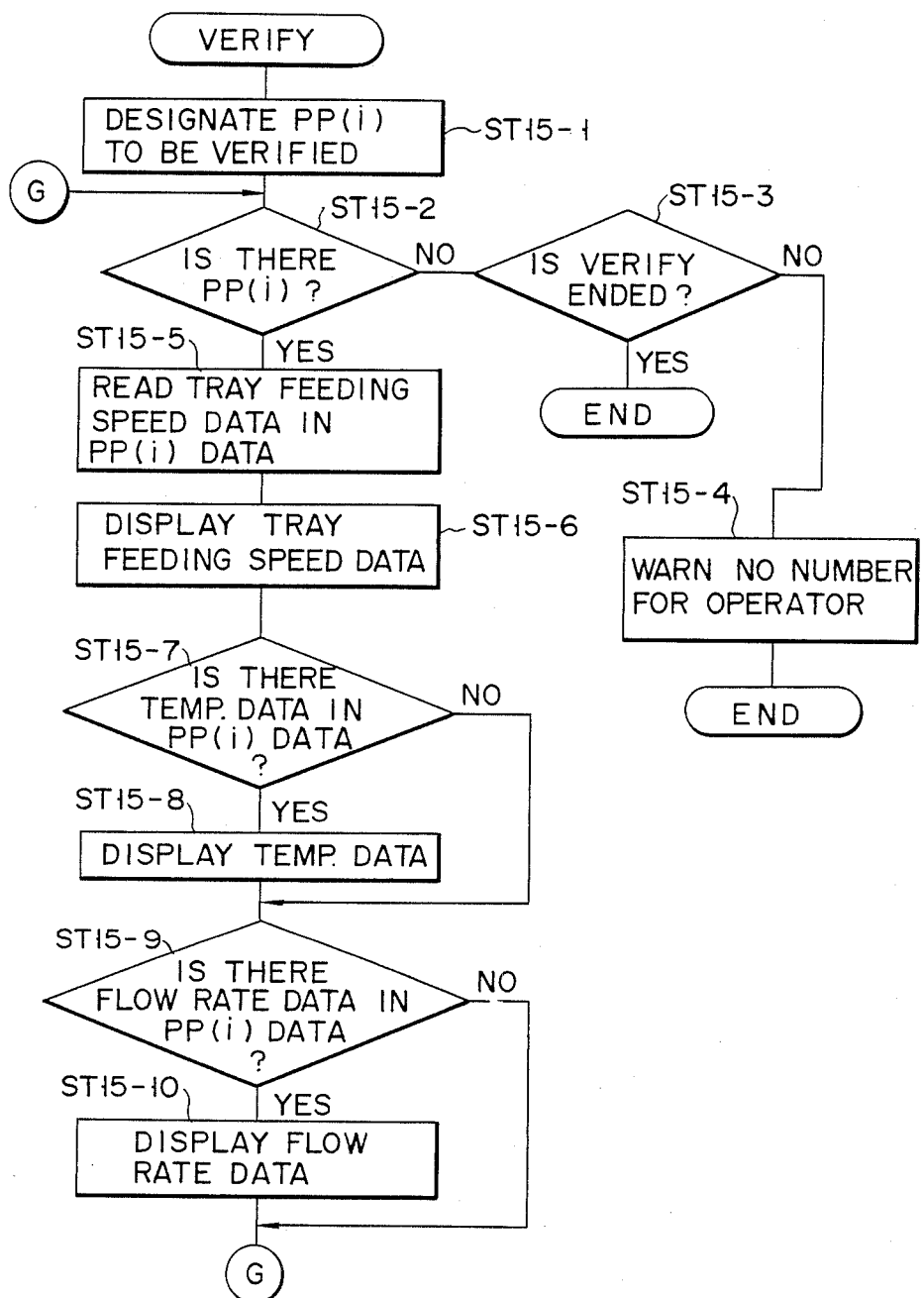
F I G. 10

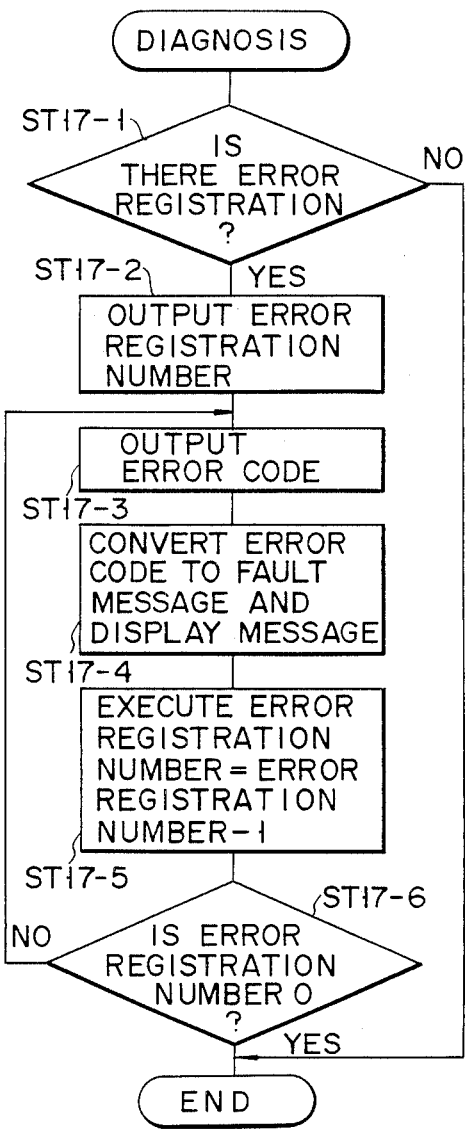
FIG. 11
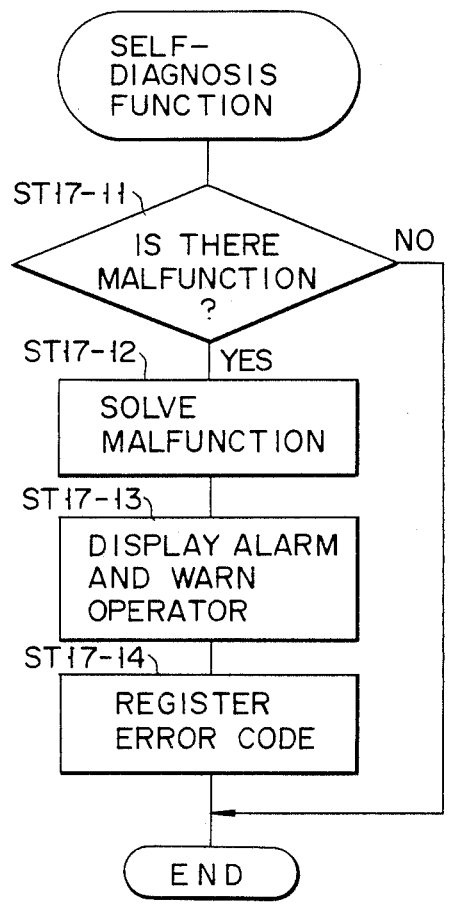
FIG. 12
| ERROR REGISTRATION NUMBER (K) |
|---|
| ERROR CODE |
| DITTO |
| DITTO |
| DITTO |
| DITTO |
| DITTO |
FIG. 13

| BIT | | | | | | | |
|---|---|---|---|---|---|---|---|
| 7 | 6 | 5 | 4 | 3 | 2 | 1 | 0 |
| 0 | 0 | 0 | 1 | 0 | 0 | 0 | 1 |
| 0 | 0 | 1 | 0 | 0 | 0 | 1 | 1 |
| 0 | 0 | 1 | 1 | 0 | 0 | 1 | 1 |
| 1 | 0 | 0 | 1 | 0 | 0 | 0 | 1 |
| 1 | 0 | 1 | 0 | 0 | 0 | 1 | 1 |

TABLE NO. — CASSETTE STATION NO. / PRESENCE OR ABSENCE OF LEFT SIDE WAFER / PRESENCE OR ABSENCE OF RIGHT SIDE WAFER / DATA SECTION

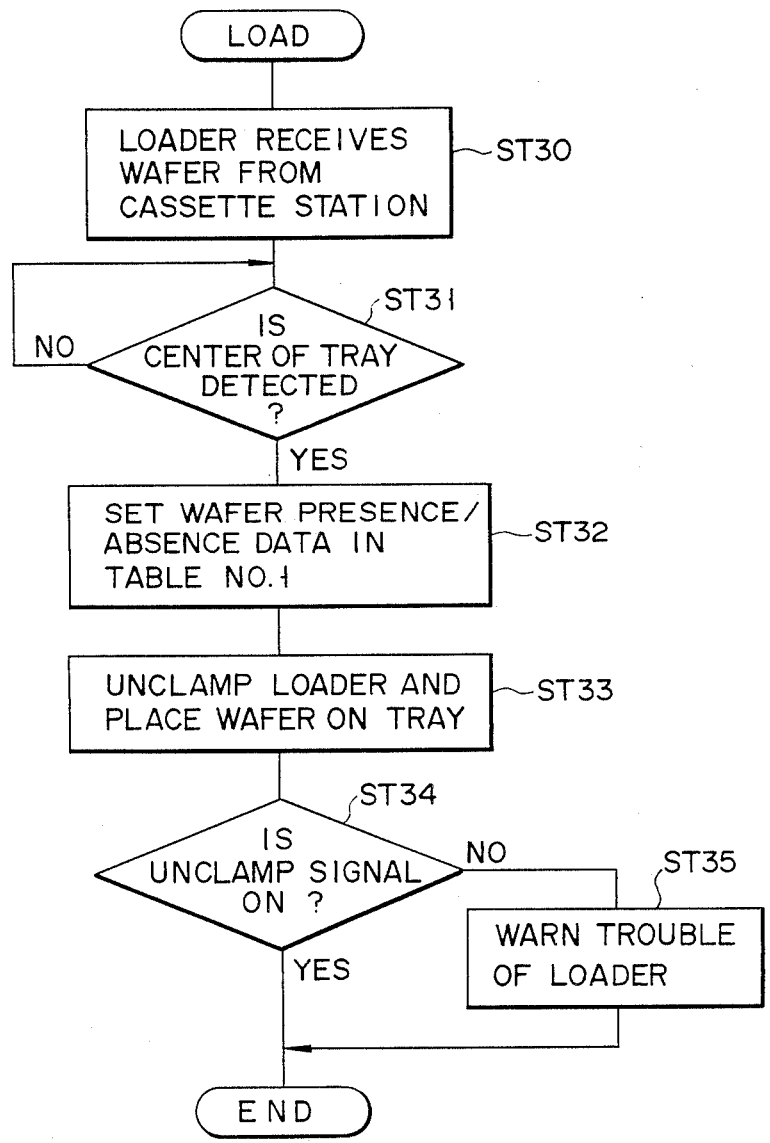
F I G. 15

| PP(i) |
|---|
| DATA SIZE |
| TRAY FEEDING SPEED DATA |
| HEATING TEMP. DATA |
| NOZZLE (51₁) FLOW RATE DATA |
| NOZZLE (51₂) FLOW RATE DATA |
| NOZZLE (51₃) FLOW RATE DATA |

| DATA SIZE |
|---|
| $N_2$ FLOW RATE DATA |
| $H_2$ FLOW RATE DATA |
| DN FLOW RATE DATA |
| DP FLOW RATE DATA |
| $SiCl_4$ FLOW RATE DATA |
| $HCl$ FLOW RATE DATA |

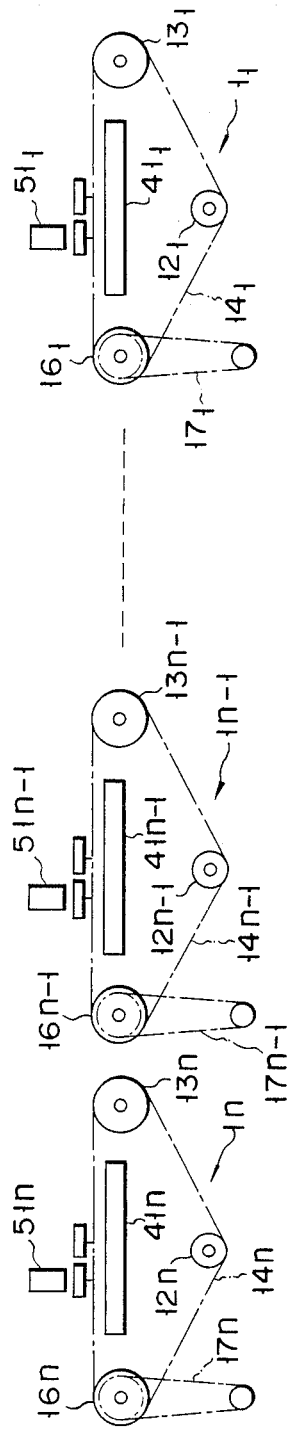

SEMICONDUCTOR VAPOR PHASE GROWTH APPARATUS

BACKGROUND OF THE INVENTION

1. Field of the Invention

The present invention relates to a semiconductor vapor phase growth apparatus and, more particularly, to an apparatus for automatically vapor phase-growing a semiconductor substrate while continuously conveying the substrate and controlling a process in the vapor phase growth according to a predetermined process program.

2. Discussion of the Background

A vapor phase growth apparatus for vapor phase-growing a semiconductor on a wafer has become widely used as semiconductor chips have recently come to be used in a wide variety of industrial fields.

Conventional vapor phase growth apparatuses can be broadly categorized as either a batch type processing system or a continuous type processing system. The former system generally has a structure wherein a rotatable susceptor on which to place wafers is provided in a cylindrical reaction furnace, a heater is mounted below the susceptor, and gas necessary for vapor phase growth is supplied to the interior. The inventors have devised an automatic controller for such a batch type processing system (as disclosed in U.S. Pat. No. 4,430,959) which is able to perform a complicated process with good reproducibility. However, this batch type system had to open and close the furnace door every time wafers are conveyed into or out of the furnace. Thus, since the wafers had to be conveyed into and out of the furnace at every batch, this type of processing system has the drawback in that its processing efficiency is very low.

The latter, i.e. continuous processing type system is superior to the former system in that a wafer is vapor phase-grown while it is being continuously conveyed. However, the operating process of the batch type system differs completely from that of the continuous type system. The continuous type system has heretofore been operated by setting the conveying speed of the wafer and a gas flow rate by means of potentiometers, and manually controlling the temperatures by means of a commercially available thermometer. Thus, the operating steps of the continuous type system are very complicated and deteriorated in its reproducibility and reliability.

SUMMARY OF THE INVENTION

An object of the present invention is to provide a semiconductor vapor phase growth apparatus which can eliminate the above-mentioned drawbacks and which provides excellent processing efficiency, thereby alleviating the workload of the operator and, thus, also permits improvements in reproducibility, reliability, and operability.

To achieve this and other objects, the present invention can perform vapor phase growth while continuously conveying a substrate of silicon or the like, and programs, in advance, information relating to its conveying speed, heating temperatures, gases to be used and their flow rate, whereby the process may be controlled according to the program.

More specifically, according to the present invention, a semiconductor vapor phase growth apparatus is provided, comprising substrate conveying means for conveying a substrate of silicon or the like, heating means for heating the substrate conveyed by the substrate conveying means, gas supply means for supplying various gases necessary for vapor phase growth on the substrate, and a controller for controlling the substrate conveying means, the heating means, and the gas supply means. This controller contains a memory area for storing a process program which includes information relating to the conveying speed of the substrate conveying means, the heating temperatures of the heating means, the type of gas to be used of the gas supply means and its flow rate, and also means for controlling the substrate conveying means, the heating means, and the gas supply means, in accordance with process program stored in the memory area.

Therefore, since the substrate conveying means, the heating means, and the gas supply means are controlled according to the process program stored in the memory area, when vapor phase-growing a semiconductor substrate while it is being continuously conveyed by the conveying means, a load for an operator can be alleviated, and the reproducibility, reliability, and operability of the processing means can all be simultaneously improved.

BRIEF DESCRIPTION OF THE DRAWINGS

FIG. 1 is a schematic view showing an embodiment of a semiconductor vapor phase growth apparatus according to the present invention;

FIG. 2 is a block diagram showing a controller of the apparatus;

FIG. 4 is a view showing the processing steps of a system program of this apparatus;

FIG. 10 is a detailed flow chart of a subroutine ST15 of FIG. 4;

FIGS. 11, 12, and 13 are detailed flow charts of a subroutine ST17 of FIG. 4;

FIG. 15 is a flow chart of a LOAD processing program;

FIG. 19 is a view for explaining a data configuration of a process program of the apparatus shown in FIG. 18;

FIG. 20 is a view for explaining the data configuration of another process programs for use in the apparatus of FIG. 18;

FIG. 21 is a schematic view of the construction of still another embodiment of the present invention; and FIG. 22 is a view for explaining a data configuration of the process program of the apparatus shown in FIG. 21.

DETAILED DESCRIPTION OF THE PREFERRED EMBODIMENTS

Figure 3:
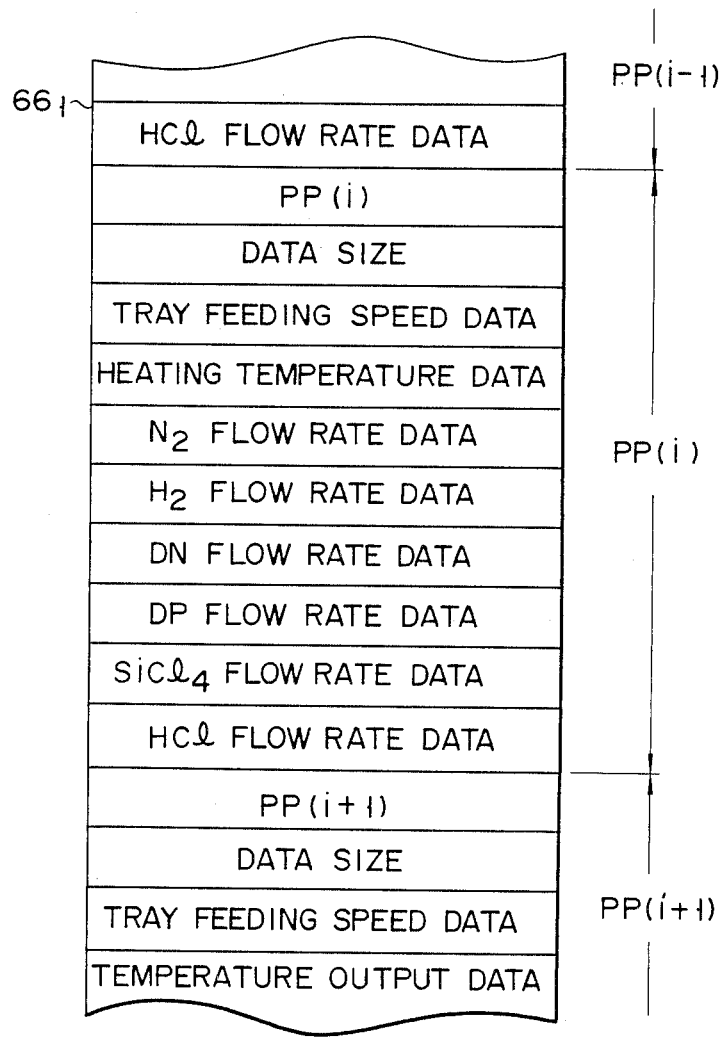
FIG. 3 is a view for explaining the data configuration of a process program.

In FIG. 1, semiconductor vapor phase growth apparatus comprises substrate conveying means 1 for conveying wafer W of a semiconductor substrate of silicon or the like, loader 2 for sequentially conveying wafer W of cassette station 7 to conveying means 1, unloader 3 for conveying wafer W conveyed by conveying means 1, heating means 4 for heating wafer W in the midway of conveying of conveying means 1, gas supply means 5 for supplying various gases necessary for the vapor phase growth of wafer W above heating means 4, and controller 6 for controlling conveying means 1, heating means 4, gas supply means 5, loader 2 and unloader 3 according to a predetermined program. Conveying means 1, loader 2, unloader 3, and cassette station 7 are contained in a room R of substantially sealed state surrounded by a dotted broken line in FIG. 1.

Conveying means 2 has chain 14 engaged in an inverted triangular shape with three sprockets 11, 12, 13. Trays 15 are at a predetermined pitch interval on chain 14, and wafers W placed on trays 15 are conveyed from the right to the left of FIG. 1. Motor 18 is coupled through chain 17 with other sprocket 16 provided coaxially with sprocket 11. When motor 18 rotates through driver 19 by a drive command from controller 6, chain 14 is rotated through chain 17 and sprocket 16. The rotating speed of chain 14, i.e., tray feeding speed is detected by a speed detector such as a tachometer generator, not shown, coupled directly with motor 18, and is then fed back to controller 6. In the conventional apparatus, a set voltage is applied by a potentiometer to driver 19, and the speed is briefly confirmed by a stop watch and a scale on tray 15.

Loader 2 has arm 21 provided elevationally and horizontally movably in reciprocated manner, and one or a plurality of clamping pawls 22 operably provided at arm 21. When wafer W of cassette station 7 is clamped by clamping pawls 22, arm 21 rises, and then horizontally moves to the loading position of substrate conveying means 1. Here, pawls 22 are opened by a signal from a sensor $S_1$ for detecting the central position of each tray 15, wafer W is conveyed on tray 15, and arm 21 is then returned to the original position. When returned, next wafer W is simultaneously received from station 7 fed by a belt or the like and is controlled to similarly place on tray 15. This operation is repeated to sequentially convey wafer W of station 7 to conveying means 1.

Unloader 3 has arm 31 provided elevationally and horizontally movably in reciprocated manner, and one or a plurality of suction units 32 provided on the lower surface of arm 31. Suction unit 32 attracts wafer W by pressure reducing effect produced when blowing air along the inner wall of unit 32. Unloader 3 operates to rise arm 31 and to then horizontally move arm 31 when wafer W arrived at wafer removing position of conveying means 1 is attracted by unit 32 if wafer W is detected by sensors $S_2$ (two, in this case) for detecting wafer W on tray 15 when passing nozzle 51 (after finishing vapor phase growth). Here, unit 32 releases the attraction of wafer W to drop wafer W on a conveyor, not shown, and then returns arm 31 to the original position. Wafer W dropped on the conveyor is recovered by the conveyor to cassette station 7. This operation is repeated to sequentially convey wafers W on conveying means 1.

Heating means 4 has heater 41 disposed in parallel with chain 14 under chain 14 between sprockets 11 and 13, and a heat generation controller 42 for controlling, for example, by an SCR, the energization of heater 41. Controller 42 turns ON or OFF a power source and regulates power in accordance with a command from controller 6 to control the heating temperature of heater 41. The heating temperature of heater 41 is detected by a temperature detector such as a thermocouple, not shown, and is then fed back to controller 6.

Gas supply means 5 has a nozzle 51 fixedly secured to an upper position thereof corresponding to heater 41, and gas switching unit 52 for supplying gas necessary for vapor phase growth to nozzle 51. Switching unit 52 supplies gas necessary for reaction to nozzle 51 such as $N_2$, $H_2$, DN, DP, $SiCl_4$, HCl and mixture gas thereof in designated flow rate in response to a command from controller 6, and is composed, for example, of a valve switching unit. Here, gas supplying flow rate is detected by a detector such as a mass flow controller, not shown, and is then fed back to controller 6. Various semiconductor vapor growth layers such as insulation layers, semiconductor layers and metal layers can be obtained by using the above-mentioned gases.

FIG. 2 shows the internal construction of controller 6. In FIG. 2, master CPU 61 is connected with data bus 62 and I/O bus 63. Data bus 62 is connected with RAM 64, CRT RAM 65, ROM 66 for storing various process programs and driving programs, and ROM 67 for storing various processing programs.

RAM 64 is used to store data used during operation of this apparatus such as input data from keyboard 78 or ON/OFF information of various switches, process programs registered in (first memory area $66_1$ of) ROM 66 to be described later or process programs given from an external memory medium such as a cassette tape.

ROM 66 has first memory area $66_1$ for storing in advance a series of process program groups to be executed in vapor phase growth of wafer W, and second memory area $66_2$ for storing a series of driving programs for driving loader 2 and unloader 3. The content of the process program stored in memory area $66_1$ is shown in FIG. 3. In FIG. 3, an initial memory area stores process program number i. Next memory area stores total data size of following memory areas. Further, next memory area stores tray feeding speed data, i.e., conveying speed data of conveying means 1. The conveying speed data fundamentally means the speed of wafer W passing under nozzle 51 to convert the speed into a time at L/feeding speed, where L is nozzle length of wafer W feeding direction of resultant nozzle 51. Thickly grown layer can be produced from a thin grown layer by varying the feeding speed. In other words, the conveying speed data means from this fact the relative speed between nozzle 51 and wafer W. Next memory area stores heating temperature data of heating means 4. Further, following memory areas respectively store flow rates of various gases necessary for vapor phase growth such as $N_2$, $H_2$, DN, DP, $SiCl_4$, HCl flow rates.

The processing programs stored in ROM 67 are as below.

(1) Processing program for controlling CPU 61 to read a process program stored in ROM 66 or registered in an external memory and to decode it to a sequence command corresponding to each program in CPU 61, i.e., program processing program (PROCESS C).

(2) Modifying program for controlling CPU 61 to modify the content of process program stored in RAM 64 (MODiFY).

(3) Program processing program for generating new process program by inputting necessary data by keyboard 78 (PROCESS).

(4) RUN processing program for displaying the process during proceeding at present on CRT 77 (RUN).

(5) Processing program for transferring process program stored in RAM 64 to an external memory medium such as cassette magnetic tape (CMT) 98 (STORE).

(6) Processing program for operating reversely to STORE function (SORT).

(7) VERiFY processing program for verifying process program stores in RAM 64 before executing the process program by processing program PROCESS.C.

(8) Processing program for self-diagnosing during operation of this apparatus (DiAGNOSiS).

(9) Processing program for calculating process lapse time for serving the lapse time during operation of one program (USED TiME).

(10) Processing program for executing various testing functions (TEST).

(11) Processing program for storing the presence or absence of wafer w for vacant trays 15 sequentially fed (LOAD).

(12) Processing program for removing wafer W from tray 15 by unloader 3 while collating with data stored by LOAD processing program.

When one of these programs is designated, CPU 61 performs necessary calculating function according to its processing program (UNLOAD).

I/O bus 63 is connected with CRT interface 68 for applying data to be displayed on CRT 77, input module 69 for inputting an input data signal from keyboard 78 to RAM 64, six modules 70 to 75 and high speed memory data transfer unit (HMT) 76. Output module 70 is connected with heat generation controller 42 of heating means 4, output module 71 is connected with gas switching unit 52 of gas supply means 5, and output module 72 is connected with motor 18 through driver 19. Output module 73 is connected with the driver of loader 2, output module 74 is connected with the driver of unloader 3, and input module 75 is inputted with data detected by the respective detectors, i.e., the tray feeding speed data of conveying means 1, the heating temperature data of heating means 4, and the flow rate data of gas supply means 5.

HMT 76 is connected with other high speed memory data transfer unit (HMT) 92 through data highway 91, and HMT 92 is connected with SUB-MASTER CPU 93 through I/O bus 97. CPU 93 is connected with ROM 95 and RAM 96 through data bus 94, and with CMT interface 99 of cassette magnetic tape (CMT) 98 through I/Obus 97.

CPU 93 transfers various programs stored in CMT 98 through CMT interface 99 to RAM 96 according to the processing program stored in ROM 95 or writes the content of RAM 96 in CMT 98. The content of RAM 96 is transferred to RAM 64 or the content of RAM 64 is reversely transferred to RAM 96 through HMTs 76, 92 and data highway 91. Thus, a problem that time required for reading program data from CMT 98 (or a magnetic card) or for writing the program in CMT 98 limits the calculating speed of CPU 61 can be avoided.

Then, the operation of the embodiment described above will be described with reference to FIGS. 4 to 17.

FIG. 4 is a flow chart showing the processing steps of system program of this apparatus. In FIG. 4, in first step (hereinbelow termed "ST1") after the program is started, inputs from keyboard 78 such as the key inputs of $PROCESS.C, $RUN, . . . are checked, and the flag of corresponding processing program (provided in a flag memory in RAM 64) is set. Then, in ST2, flag bit of process control flag (that $PROCESS.C is inputted) is first checked. If YET in ST2, the process is controlled in ST3. If NO in ST2, a control is advanced to ST4 to check next MODiFY flag.

Thus, the flags corresponding to the processing program are sequentially checked to execute the processing program corresponding to the flag state. ST4 to ST21 correspond to processing programs from MODiFY to TEST in ROM 67 in FIG. 2. One or ST5 to ST21 is selected to be valid.

Figures 4B, 5:
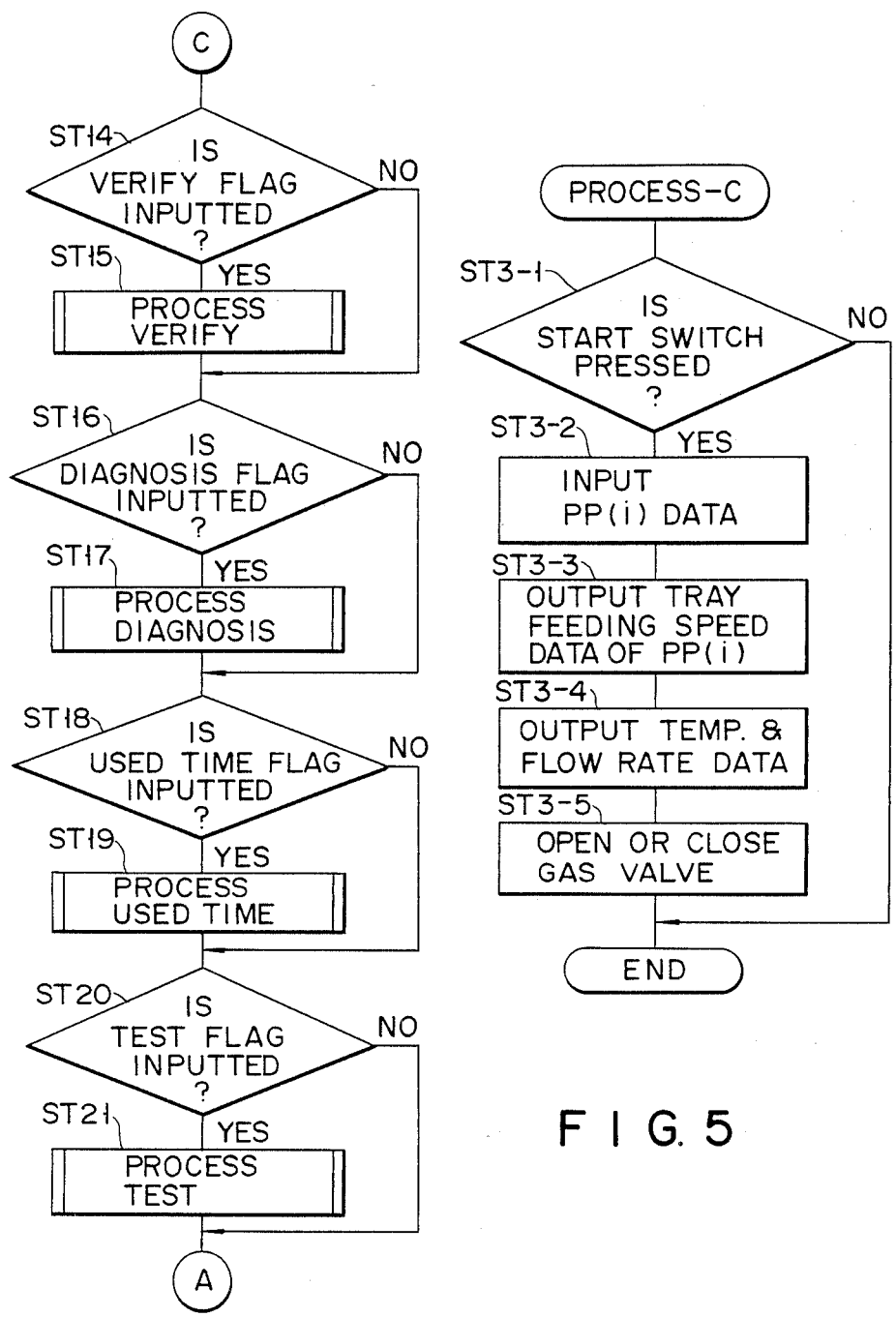
FIG. 5 is a detailed flow chart of a subroutine ST3 of FIG. 4.

FIG. 5 is a detailed flow chart of process control subroutine (ST3) of FIG. 4. ST3 is attached to processing steps for displaying the concrete content of ST3. In FIG. 5, when a start switch is pressed in ST3-1, a control is advanced to ST3-2. In ST3-2, the data of process program PP(i) designated from RAM 64 is inputted. Then, in ST3-3, the tray feeding speed data of inputted PP(i) is outputted to driver 19 to rotate motor 18 according to the given tray feeding speed data. Then, tray 15 is fed at the designated speed. Thus, when wafers W of cassette station 7 are sequentially conveyed by loader 2 to conveying means 1, wafers W are placed on trays 15, conveyed at designated feeding speed, then conveyed out by unloader 3, and then recovered to station 7.

Then, in ST3-4, data regarding the temperature of PP(i) is outputted to heat generation controller 42 to heat heater 41 to designated temperature. Simultaneously, data regarding flow rates of various gases are outputted to gas switching unit 52, and the gas valve of switching unit 52 is opened or closed in ST3-5. Then, the various gases are supplied through nozzle 51 at flow rate designated by PP(i) to wafer W.

Thus, wafer W is conveyed at speed designated by conveying means 1, is heated to the designated temperature in the conveying midway, and the various gases necessary for reaction are supplied at designated flow rate. Resultantly, wafer W is continuously vapor phase grown. Further, since the tray feeding speed, the heating temperature of heater 41, the types and flow rate of gases are controlled according to the predetermined process program, a load of an operator is reduced to improve the reliability and the operability.

Figure 6:
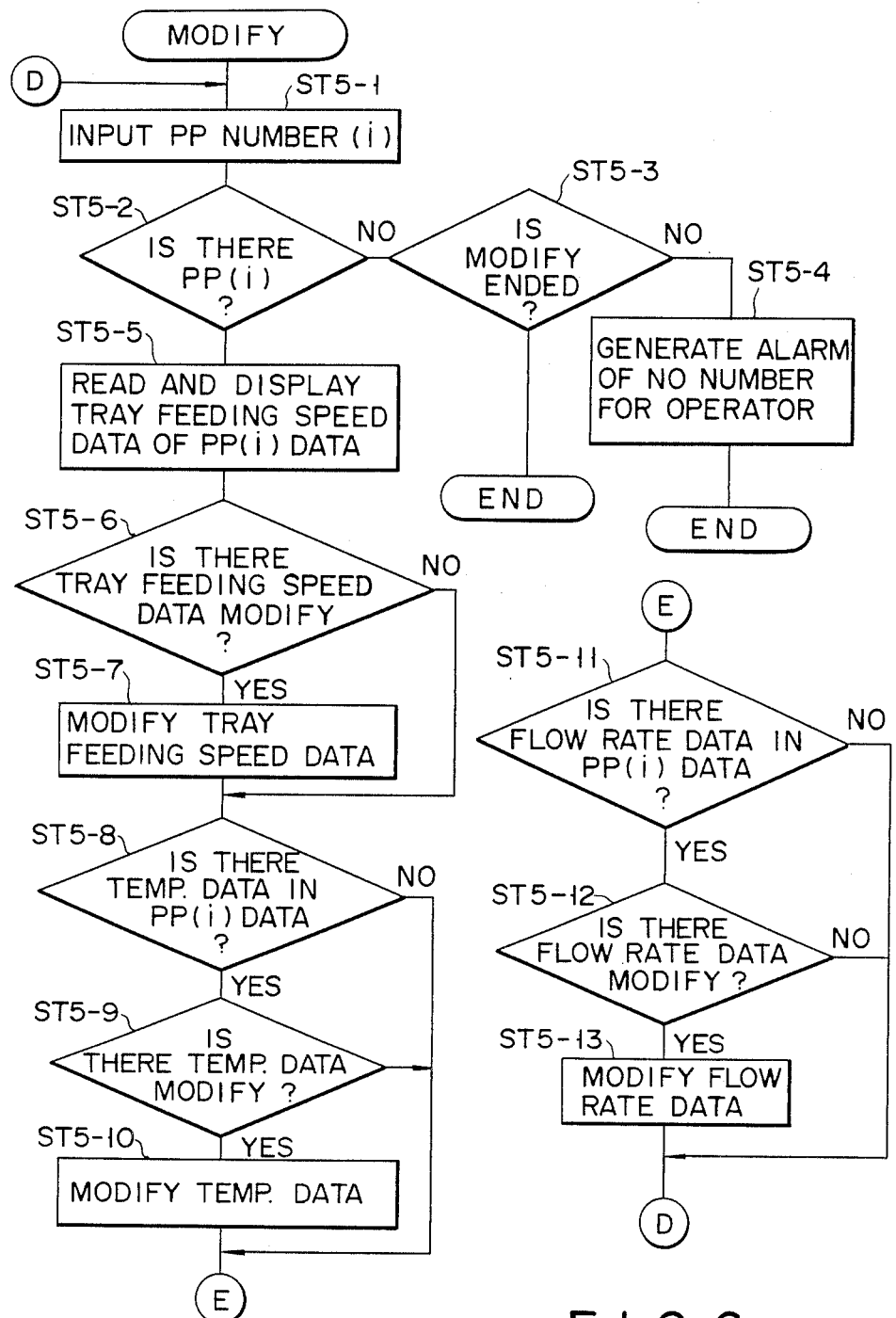
FIG. 6 is a detailed flow chart of a subroutine ST5 of FIG. 4.

FIG. 6 is a detailed flow chart of MODiFY processing subroutine (ST5) of FIG. 4. In FIG. 6, when process program PP number (i) to be modified in ST5-1 is inputted from keyboard 78, a control is advanced to ST5-2, whether is there PP(i) input here in RAM 64 is checked. IF NO in ST5-2, whether is the modifying operation ended or not is checked in ST5-3, while if YES in ST5-2, the operation is ended. If NO in ST5-3, an alarm of no number is generated for an operator in ST5-4, and the operation is ended.

If YES in ST5-2, a control is advanced to ST5-5, the tray feeding speed data of PP(i) data is read and displayed. Then, a control is advanced to ST5-6, when the tray feeding speed date is desired to be modified, the tray feeding speed data is modified in ST5-7. Subsequently, a control is advanced to ST5-8 and then ST5-9, and when the temperature data is desired to be modified, the data is modified in ST5-10. Further, a control is advanced to ST5-11 and then ST5-12, and when the gas flow rate data is desired to be modified, the data is modified in ST5-13. Successively, necessary data in PP(i) is sequentially designated to modify the data.

Then, PROCESS processing subroutine (ST7) of FIG. 4 will be described. This is processing function for generating process program to be executed in PROCESS processing. After $PROCESS is inputted, process name, programming data and a manufacturer, etc. are then registered as a directory as additional information. Then, the process of the type to be executed is inputted as a process pattern. If the vapor phase growth of N type is executed, following display is inputted.

process pattern=EPiN

The underlined portion is inputted portion.

Thus, after various information is inputted, process program PP to be executed next is generated. Next message is outputted from the system side, necessary information is inputted to generate process program for sequentially forming EPiN to complete the program. For example, SEQUENCE=PP (1)
Tray feeding speed=150 (mm/min)
Heating temperature=1200 (°C.)
$N_2$=0 (cc)
$H_2$=100 (liters)
DN=120 (cc)
DP=0 (cc)
$SiCl_4$=10 (g)
HCl=0 (cc)

Figure 7:
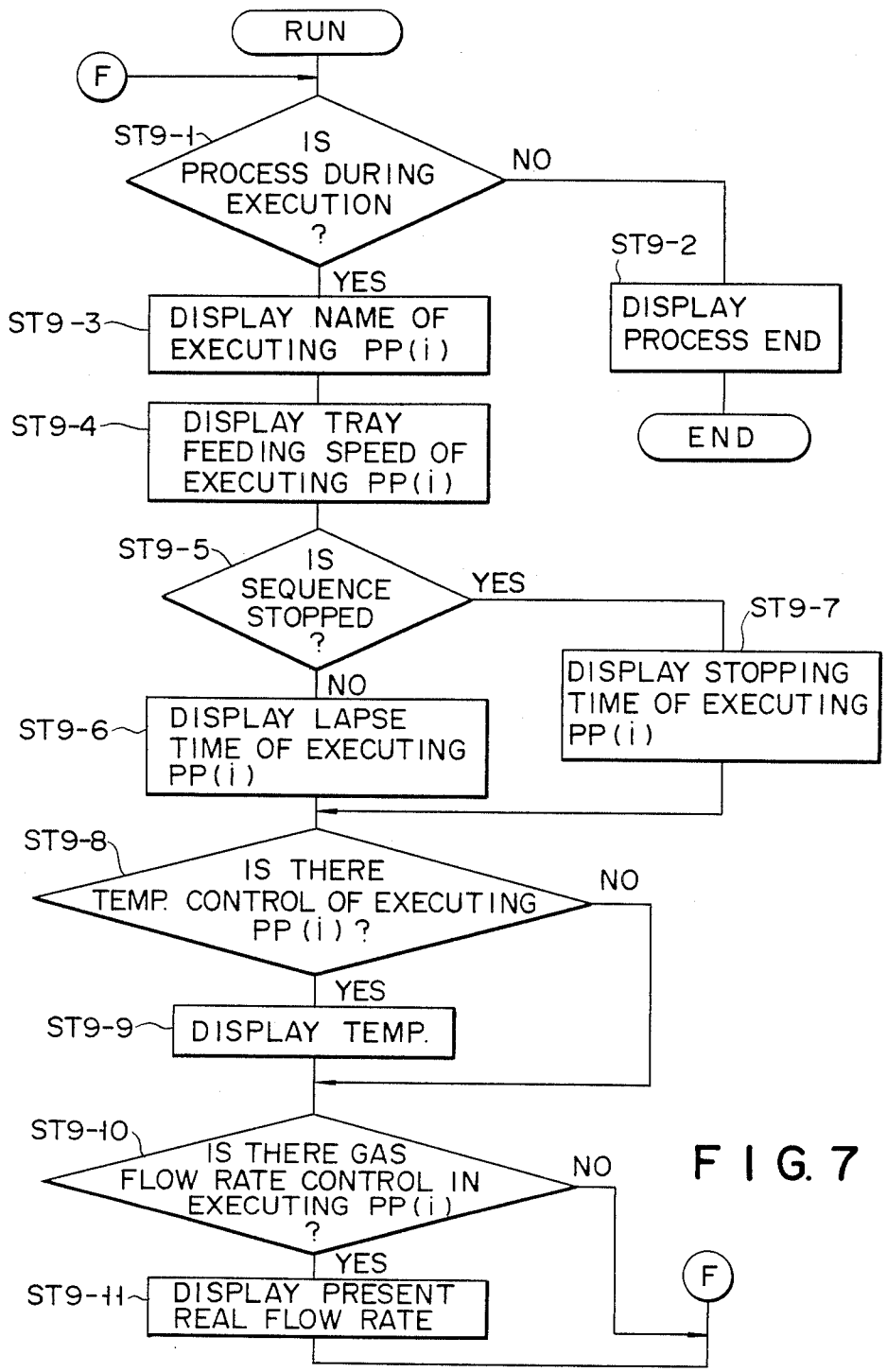
FIG. 7 is a detailed flow chart of a subroutine ST9 of FIG. 4.

FIG. 7 is a detailed flow chart of RUN processing subroutine (ST9) of FIG. 4. In FIG. 7, in ST9-1, whether is the process is during executing or not is checked. If NO in ST9-1, a control is advanced to ST9-2 to display the process end (e.g., $$$). If YES in ST9-1, a control is advanced to ST9-3 to display name of the executing process program PP(i). Then, a control is advanced to ST9-4 to display the tray feeding speed data of executing PP(i). Subsequently, in ST9-5, whether the sequence is stopper or not is checked. If YES in ST9-5, a control is advanced to ST11-7 to integrate and display the stopping time of executing PP(i). This sequence stop occurs due to the instruction of the sequence stop caused by any malfunction during automatic operation by an operator, and this stop will not generate ordinarily during normal automatic operation.

If NO in ST9-5, a control is advanced to ST9-6 to display the lapse time of executing PP(i). Then, a control is advanced to ST9-8 to check whether executing PP(i) is managed at temperature or not. If YES in ST9-8, a control is advance to ST9-9 to display the present temperature of heater 41. If NO in ST9-8, a control is advanced to ST9-10 to check whether executing PP(i) manages gas flow rate or not. If YES in ST 9-10, the present real flow rate is displayed in ST9-11. If NO in ST9-10, the control is returned to combining point F.

Figure 8:
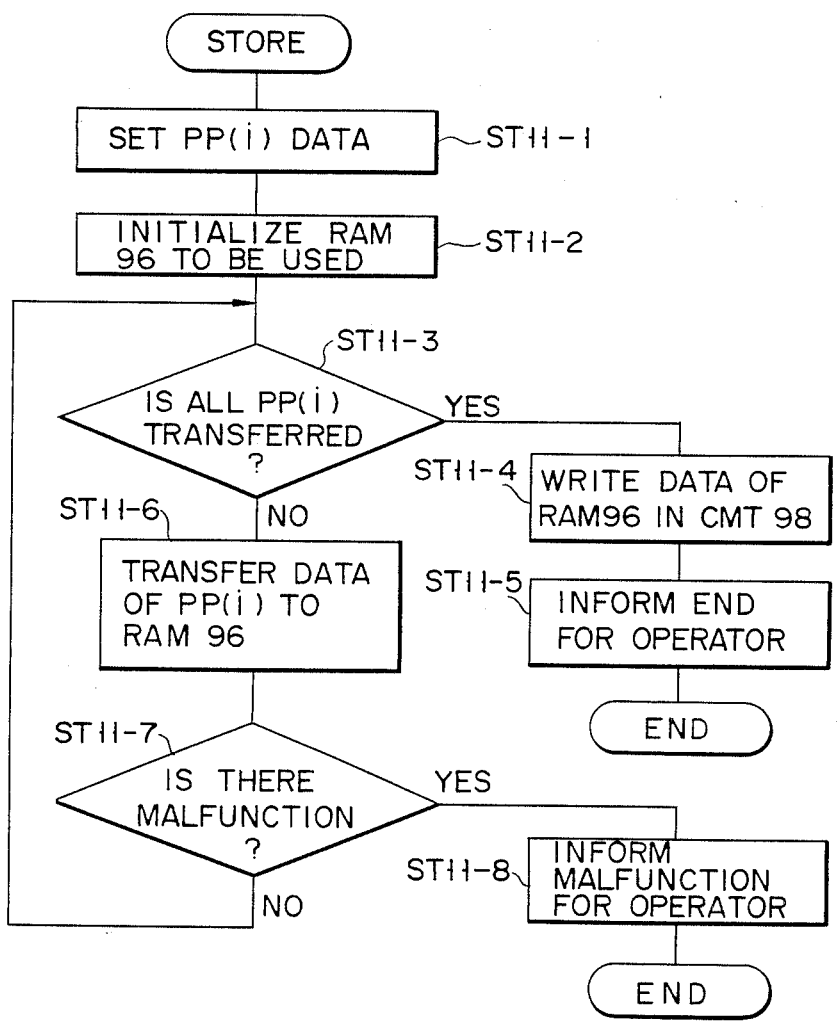
FIG. 8 is a detailed flow chart of a subroutine S11 of FIG. 4.

FIG. 8 is a detailed flow chart of STORE processing subroutine (ST11) of FIG. 4. In FIG. 8, process program PP(i) data to be stored in an external memory medium is set (to prepare to transfer to RAM 96) in ST11-1, and RAM 96 to be used in ST11-2 is initialized. Then, a control is advanced to ST11-3 to check whether all data of PP(i) from RAM 64 are transferred to RAM96 or not. If YES, data from RAM 64 is ended to be transferred to RAM 96. Then, a control is advanced to ST-4 to execute the transfer of data from RAM 96 to CMT 98 by the program of ROM 95. When the transfer of the data to CMT 98 is ended, ST11-5 informs the end for the operator. If NO in ST11-5, a control is advanced to ST11-6, PP(i) data is transferred to RAM 96.

Subsequently, a control is advanced to ST11-7 to check whether there is a malfunction or not. If YES, ST11-8 informs the malfunction for the operator. If NO in ST11-7, a control is advanced to ST11-6 to transfer PP(i) data to RAM 96.

Then, a control is advanced to ST11-7 to check whether is there a malfunction or not. If YES, ST11-8 informs the malfunction for the operator. If NO in ST11-7, a control is again returned to ST11-3, and the above operation is repeated. As understood from a block diagram of the apparatus in FIG. 2, the STORE processing process temporarily stores PP(i) stored in RAM 64 through I/O bus 63, HMT 76, and data highway 94 in RAM 96, and then stores PP(i) stored in RAM 96 in CMT 98 of one of external memory media by CPU 93 and ROM 95.

Figure 9:
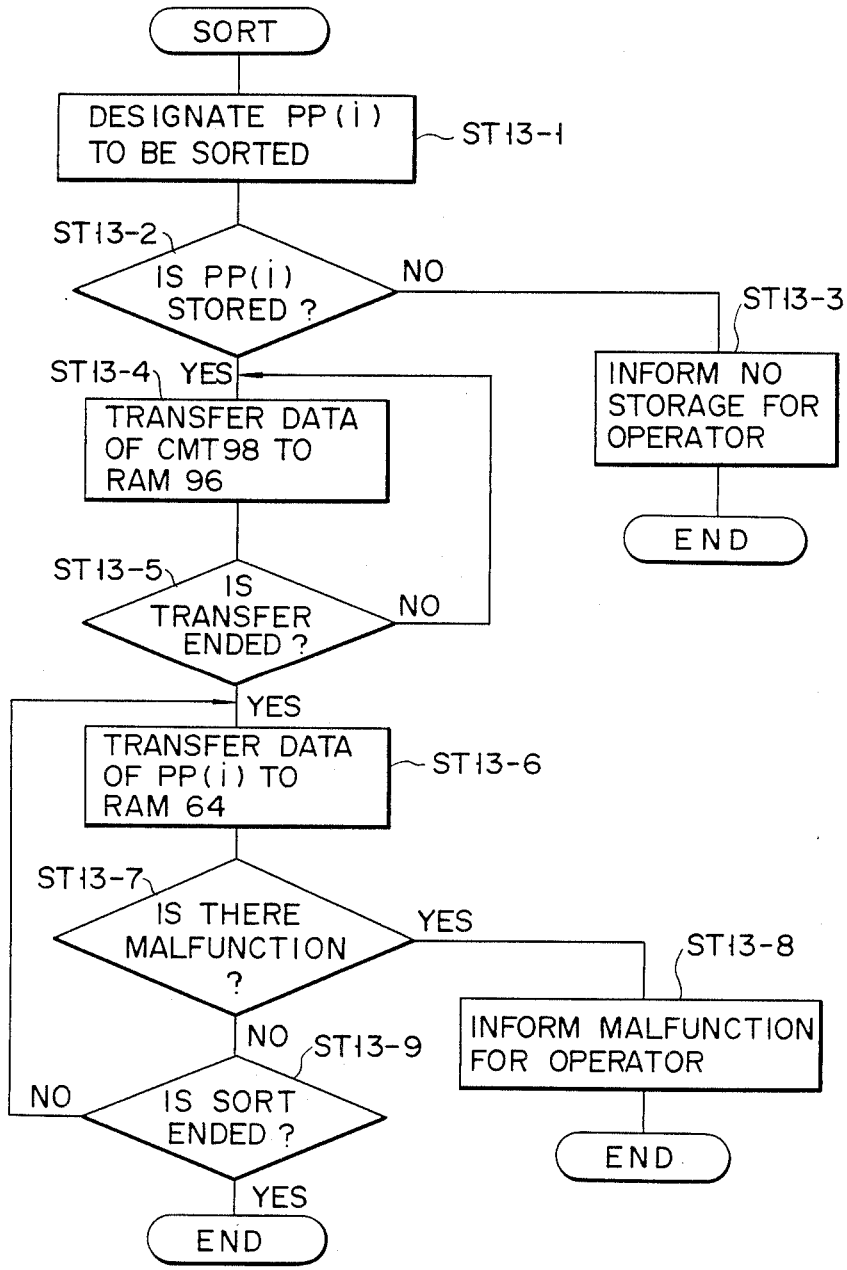
FIG. 9 is a detailed flow chart of a subroutine ST13 of FIG. 4.

FIG. 9 is a detailed flow chart of SORT processing subroutine (ST13) of FIG. 4. In FIG. 9, ST13-1 designates one process program PP(i) to be sorted from now on. Then, a control is advanced to ST13-2 to check whether PP(i) designated in ST13-1 is stored in CMT 98 or not. If NO in ST13-2, a control is advanced to ST13-3 to inform NO for the operator. If YES in ST13-2, a control is advanced to ST13-4 to transfer data regarding PP(i) from CMT 98 to RAM 96 (by ROM 95 and CPU 33).

Then, a control is advanced to ST13-5 to check whether the transfer from CMT 98 to RAM 96 is ended or not. If NO, a control is returned to ST13-4. If YES, a control is advanced to ST13-6 to transfer the PP(i) data to RAM 64 of main memory. Then, in ST13-7, whether is there a malfunction or not is checked. If YES, ST13-8 informs the malfunction for the operator. If NO, a control is advanced to ST13-9 to check whether the transfer from RAM 96 to RAM 64 is ended or not. If YES, the SORT process is ended to for example, display $$$. If NO in ST13-9, returned to ST13-6, and this loop is repeated.

FIG. 10 is a detailed flow chart of VERiFY processing subroutine (ST15) of FIG. 4. In FIG. 10, ST15-1 designates PP(i) to be verified. Then, a control is advanced to ST15-2 to check whether is there designated PP(i) or not. If NO, a control is advanced to ST15-3 to check whether the VERiFY processing program is ended or not. If NO, a control is advanced to ST15-4 to warn the presence of no number for the operator.

If YES in ST15-2, a control is advanced to ST15-5 to read the tray feeding speed data in PP(i) data. Then, advanced to ST15-6 to display the tray feeding speed data on CRT 77. Subsequently, in ST15-7, whether there is temperature data in PP(i) data or not. If YES, ST15-8 displays the temperature data on CRT 77. Then, ST15-9 checks whether there is flow data of used gas in PP(i) data. If YES, ST15-10 displays the flow rate data on CRT 77, a control is returned to combining point G, and ST15-2 to ST15-10 are then repeated as described above.

FIG. 11 is a detailed flow chart of DiAGNOSiS processing subroutine (ST17) of FIG. 4. In FIG. 11, ST17-1 checks whether there is error registration or not. This error registration registers error registration number and error code in error code registration area (FIG. 13) of RAMs 64, 96 by the execution of self-diagnosis program in FIG. 12. If YES in ST 17-1, a control is advanced to ST17-2, the error registration number (k in FIG. 13) is outputted, ST17-3 then outputs error codes, ST17-4 then converts the error code outputted in ST17-4 into a corresponding fault message, and displays on CRT 77. Subsequently, ST17-6 checks whether error registration number (undisplayed error number) is zero or not. If NO, returned to ST17-3. If YES, this problem is ended.

FIG. 12 is a detailed flow chart of self-diagnosing function in the proceeding process omitted in the description in the explanation of the above-mentioned PROCESS.C processing program. ST17-11 checks the presence or absence of a malfunction. This checks the feeding of the tray, the temperature, the flow rate and the supplied voltage to various valve units. If ST17-11 checks a malfunction, a control is advanced to ST17-12 to apply a command necessary to remove the malfunction regarding the apparatus or peripheral devices and units. For example, the progress of the sequence is temporarily stopped.

Then, ST17-13 displays an alarm to warn the operator. ST17-14 registers the error code in the corresponding memory area (FIG. 13) of RAM 64.

Figures 14, 16:
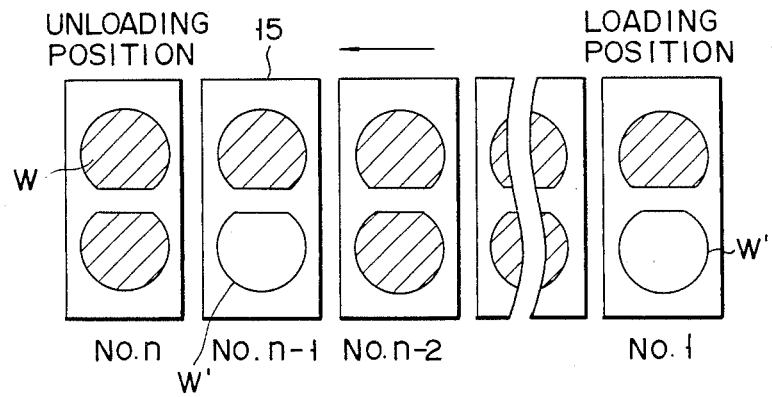
FIG. 14 is a schematic plan view showing an example of a method of placing a wafer on a tray.
FIG. 16 is a view for explaining a data memory configuration of a wafer-loaded state accompanied by LOAD and UNLOAD processing programs.

FIG. 14 shows an example of wafer placing states of n pieces of trays 15 from a tray 15 at the loading position (tray No. 1) for conveying wafers W by loader 2 to a tray 15 disposed at unloading position (tray No. n) for conveying wafer W by unloader 3 in FIG. 1. Wafers W illustrated by shaded portions are placed on the trays, and wafers W' indicated by while circles are not placed on the trays.

In FIG. 14, wafers W are not placed on trays 15 Nos. n-1 and 1 at left side toward advancing direction. This case occurs when wafer W stored in station 7 is wasted out or a placement rejection command for specific tray 15 discriminated in advance is outputted.

FIG. 15 is a flow chart illustrating LOAD processing program for storing whether wafer W is actually loaded on tray 15 or not to process when predetermined number of wafers W are not always loaded on tray 15 as shown in FIG. 14. This program is started, for example, when the fact that one of trays 15 is approached to loading position is detected by tray position detecting plate 12a rotating in cooperation with sprocket 12 and sensor 13b in FIG. 1 to operate loader 2. In FIG. 15, at ST30, a wafer W is first received by loader 2 from cassette station 7. Loader 2 is driven by driving program in second memory area $66_2$ of ROM 66. When ST31 detects the central position of tray 15 to be conveyed with wafer W by sensor $S_1$, a control is advanced to ST32 to set the presence or absence of wafer W in the memory area in FIG. 16 of RAM 64 according to whether loader 2 actually conveys waver W on tray 15 or not, i.e., whether ST30 receives wafer W or not. This memory area indicates Table No. in four more significant bits in 8 bits, cassette station No. in next two bits, 1 bit of two less significant bits corresponding to left side (FIG. 14) toward the advancing direction of tray 15, 0 bit corresponding to right side, stores the presence or absence of wafer W by "1" or "0". ST32 sets data in table No. 1. When a plurality of cassette stations 7 are provided, loader 2 reads and stores cassette station Nos. The Nos. are expressed as "01", "10", "11", and "00" indicates no designation. The table Nos. correspond to trays 15, but do not correspond to trays 15 one by one. After ST32 stores the presence or absence of the loading of wafer W, ST33 unclamps the loader 2 to place wafer W on tray 15. ST34 verifies ON or the unclamping signal, i.e., and actually verifies whether wafer W is actually loaded on tray 15 or not. If not ON, ST35 generates an alarm of a mechanical trouble of loader 2, and If ON, this program is ended. This program is repeated whenever trays 15 are opposed to loader 2.

Figure 17:
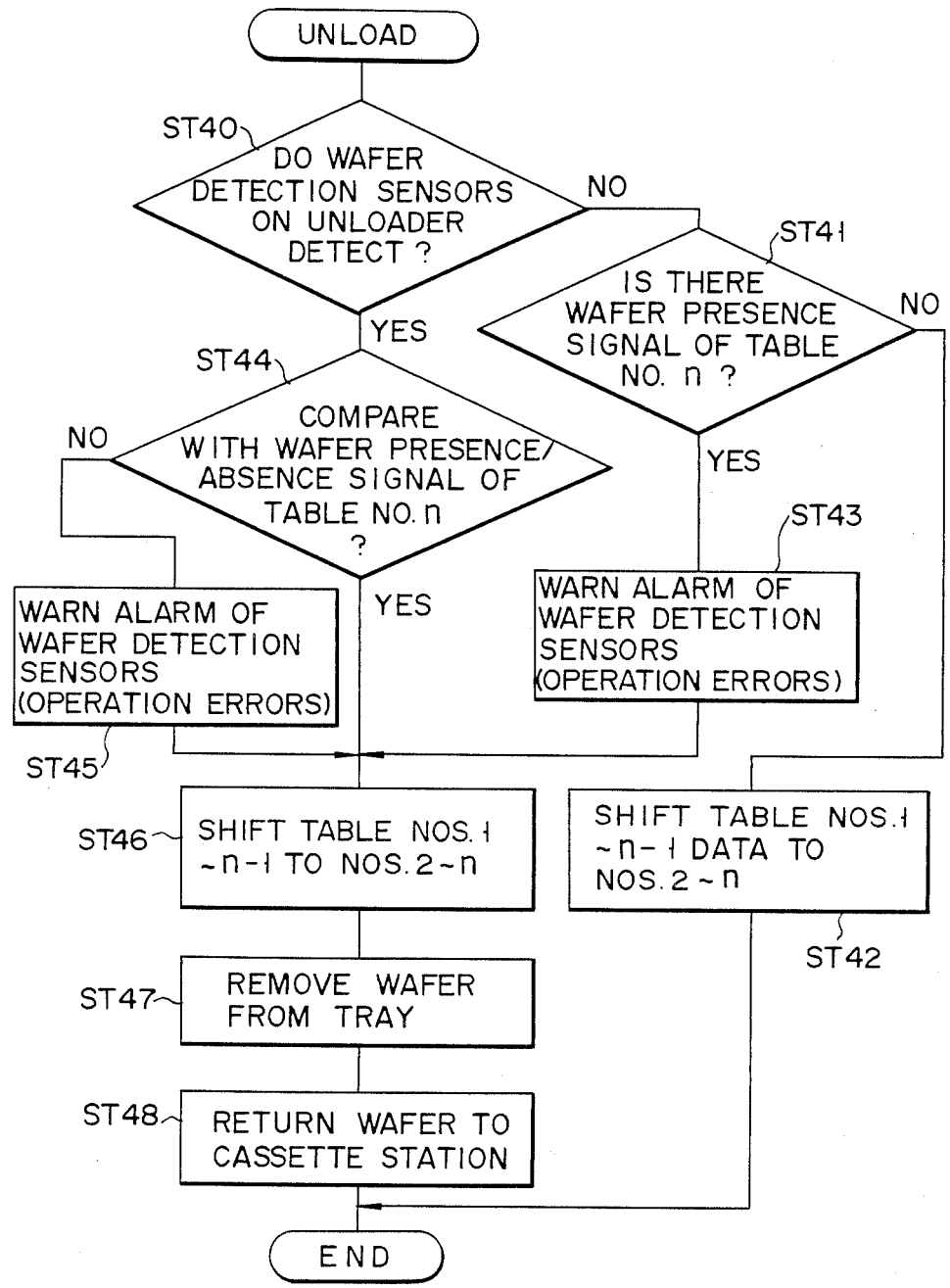
FIG. 17 is a flow chart of an UNLOAD processing program.

FIG. 17 is a flow chart showing UNLOAD processing program. This program is started by approaching one of trays 15 to unloader 3 and starting unloader 3, similarly to when wafer W is loaded by loader 2. ST40 detects by sensors $S_2$ provided for both wafers W the presence or absence of wafer W on tray 15 to be unloaded. If sensors $S_2$ do not produce outputs, ST41 checks the presence or absence of a signal based on data (presence or absence of wafer W) of table No. n in FIG. 16. If NO, ST42 shifts data of table Nos. 1 to n-1 to Nos. 2 to n to end this program. In other words, since wafer W to be unloaded is not presented, the unloading operation is not executed, the data is shifted to allow table No. 1 to be wafer receiving standby state, and the data of No. n-1 is shifted to No. n to be next unloaded.

Then, if there are, for example, 10 trays 15 from loading position to unloading position, the data is set in table No. 1 when this apparatus is started in operation. Since data are all "0" in Nos. 2 to n=10 at this time, unloader 3 repeats ST40, ST41 and ST42 in initial nine times, and tray 15 loading initially wafer W arrives at unloading position in tenth time, and the data of the presence or absence of wafer W on tray 15 is stored in table No. n.

Thus, when a signal of presence of wafer is outputted from table No. n, ST41 becomes YES. In this case, ST43 outputs a malfunction alarm of sensors $S_2$, and advances to next ST46.

If YES in ST40, a control is advanced to ST44 to compare with wafer presence/absence signal of table No. n. If coincidence, a control is shifted to next ST46. If incoincidence, ST45 outputs a malfunction alarm of sensor, and advances to next ST46. ST46 shifts data of table Nos. 1 to n-1 to table Nos. 2 to n similarly to ST42 to become next loading/unloading standby state. ST47 removes wafer W from tray 15 according to data of table No. n, and ST48 operates according to data of table No. n to return wafer W to cassette station 7. If cassette station No. is designated by "01" to "11" at this time, wafer W is returned to station 7 of the No.

LOAD processing program in FIG. 15 has exemplified to store the presence or absence of wafer W actually loaded on tray and to operate unloader 3 according to the data. However, all trays 15 may be in advance numbered, the loading states of wafers W on trays 15 may be stored in memory, and loading and unloading may be executed according to data in the memory.

Figures 18, 19A, 19B:
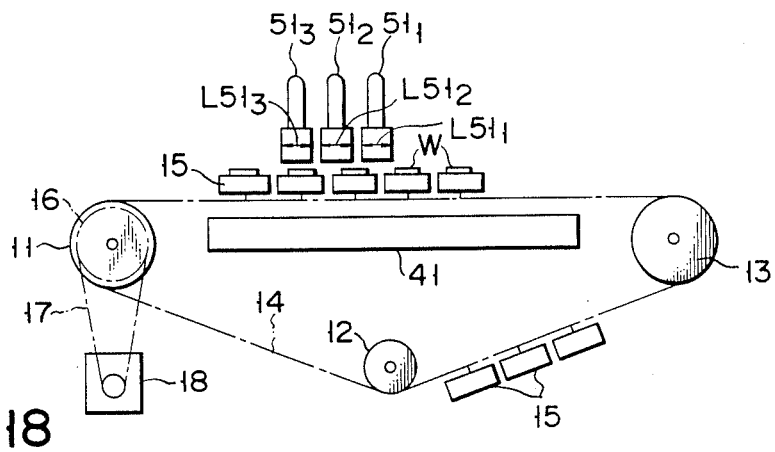
FIG. 18 is a schematic view of the construction of another embodiment of the present invention.

As described above, the vapor phase growth apparatus which has had one nozzle 51 has been described. However, a plurality of nozzles $51_1$, $51_2$, $51_3$ may be provided, for example, as shown in FIG. 18. In this case, as shown in FIG. 19(A), the flow rate data of used gas are set to respective nozzles $51_1$, $51_2$, $51_3$. Since the trays are fed by one motor 18 and heater 41 of heating means 4 is controlled by heat generation controller 42, the process program data of nozzles $51_1$, $51_2$, $51_3$ are only flow rate data in FIG. 19(B).

In the apparatus in FIG. 18, tray feeding speed is fixed to film conditions, process programs in FIG. 20 are prepared for respective nozzles $51_1$, $51_2$, $51_3$, the flow rates of nozzles $51_1$, $51_2$, $51_3$ are generally obtained by the following equation, and the flow rates to be outputted may be decided.

Flow rate=Total flow rate/tray feeding speed

As shown in Fig. 21, a plurality of substrate conveying means $1_1$ to $1_n$ are sequentially disposed, and nozzles $51_1$ to $51_n$ may be correspondingly arranged. Process programs of this case are prepared for respective units as in FIG. 22. Substrate conveying means is not limited to the type of conveying trays 15 via chain 14. Various other changes and modifications may be made within the spirit and scope of the present invention. For example, trays 15 may be conveyed from the right and conveyed out to the left directly on heater 41 or by providing guide rails on heater 41, or trays 15 may be circulated in a horizontal plane.

According to the present invention as described above, information of conveying speed, heating temperature, used gases and flow rates is programmed to vapor phase grow the semiconductor substrate while continuously conveying and the process is executed according to the program. Therefore, a load of the operation can be alleviated to improve reliability and operability.

What is claimed is:

1. A semiconductor vapor phase growth apparatus comprising:
    substrate conveying means for conveying a substrate of silicone or the like,
    heating means for heating said substrate conveyed by said substrate conveying means,
    gas supply means for supplying various gases necessary for vapor phase growth on said substrate, and
    a controller for controlling said substrate conveying means, said heating means, and said gas supply means,
    said controller having a memory area for storing a process program including information concerning conveying speed of the substrate conveying means, heating temperatures of the heating means, the type of gas to be used of the gas supply means and its flow rate, and means for controlling the substrate conveying means, the heating means, and the gas supply means, in accordance with the process program stored in the memory area, wherein said apparatus further comprises a control means including a self-diagnosis function for stopping supply of substrates into said substrate conveying means when a malfunction of said apparatus occurs.

2. The semiconductor vapor phase growth apparatus according to claim 1, wherein said memory are stores a plurality of types of process programs.

3. The semiconductor vapor phase growth apparatus according to claim 1, further comprising:
    substrate conveying in and out means for conveying the substrate into conveying means,
    said controller having
    a memory area for storing the conveyed state of the substrate, and
    means for controlling conveying out means according to data stored in the memory area.

4. The semiconductor vapor phase growth apparatus according to claim 3, wherein said memory area for storing the conveyed state of the substrate is able to store the number and positions of substrates in respective units (trays) of the substrate conveying means.

5. The semiconductor vapor phase growth apparatus according to claim 1, further comprising:
    substrate conveying in and out means provided for said substrate conveying means;
    a memory area provided in said controller for storing data representing cassette station No. of the substrate to be conveyed in; and
    means for controlling conveying out operation of said substrate conveying in and out means according to data stored in the memory area.

* * * * *